(12) United States Patent
Olodort

(10) Patent No.: US 9,443,402 B2
(45) Date of Patent: Sep. 13, 2016

(54) VIBRATORY ALERT DEVICE

(71) Applicant: OnBeond, LLC, Santa Monica, CA (US)

(72) Inventor: Robert Olodort, Santa Monica, CA (US)

(73) Assignee: Simple Matters LLC, Santa Monica, CA (US)

( * ) Notice: Subject to any disclaimer, the term of this patent is extended or adjusted under 35 U.S.C. 154(b) by 148 days.

(21) Appl. No.: 14/213,375

(22) Filed: Mar. 14, 2014

(65) Prior Publication Data

US 2014/0266607 A1    Sep. 18, 2014

Related U.S. Application Data

(60) Provisional application No. 61/792,536, filed on Mar. 15, 2013.

(51) Int. Cl.
| | | |
|---|---|---|
| *H04Q 1/30* | (2006.01) | |
| *G08B 6/00* | (2006.01) | |
| *H05K 7/14* | (2006.01) | |
| *H04M 1/725* | (2006.01) | |
| *H04M 19/04* | (2006.01) | |

(52) U.S. Cl.
CPC .............. *G08B 6/00* (2013.01); *H04M 1/7253* (2013.01); *H04M 19/047* (2013.01); *H05K 7/14* (2013.01); *H04M 2250/02* (2013.01)

(58) Field of Classification Search
CPC ........ G08B 6/00; H04M 19/047; H05K 7/14
See application file for complete search history.

(56) References Cited

U.S. PATENT DOCUMENTS

| | | | |
|---|---|---|---|
| 6,091,331 A | * | 7/2000 | Toft .................... A62B 9/00 340/321 |
| 8,532,645 B2 | | 9/2013 | Enzmann et al. |
| 2002/0094849 A1 | | 7/2002 | Cannon et al. |
| 2002/0128051 A1 | | 9/2002 | Liebenow |
| 2003/0022701 A1 | | 1/2003 | Gupta |
| 2003/0071791 A1 | | 4/2003 | Hanson et al. |
| 2004/0185913 A1 | | 9/2004 | Aoshima et al. |
| 2004/0192409 A1 | | 9/2004 | Chan et al. |
| 2004/0242286 A1 | | 12/2004 | Benco et al. |
| 2006/0099995 A1 | | 5/2006 | Kim et al. |
| 2006/0264234 A1 | | 11/2006 | Akama |
| 2008/0268780 A1 | | 10/2008 | Werner et al. |

(Continued)

OTHER PUBLICATIONS

Invitation to Pay Additional Fees for corresponding International Application No. PCT/US2014/029544, mailing date Jul. 4, 2014, 5 pages.

(Continued)

*Primary Examiner* — Omeed Alizada
(74) *Attorney, Agent, or Firm* — Blakely, Sokoloff, Taylor & Zafman LLP

(57) ABSTRACT

A simplified Bluetooth Low Energy or Bluetooth compatible vibrator, that can be paired with a cellular telephone or other device, has in one embodiment no buttons, no switches, no ports, no input device, and no display. The vibrator can use a non-rechargeable battery and can be automatically paired with the cellular telephone (or other device) in response to initially inserting the non-rechargeable battery into the vibrator. A low battery monitoring circuit can detect a low battery condition and cause the vibrator to send a low battery warning message to the cellular telephone to remind the user to replace the non-rechargeable battery.

20 Claims, 10 Drawing Sheets

(56) References Cited

U.S. PATENT DOCUMENTS

| | | |
|---|---|---|
| 2010/0099394 A1 | 4/2010 | Hainzl |
| 2010/0255880 A1 | 10/2010 | Huang et al. |
| 2011/0057809 A1 | 3/2011 | Mahoney |
| 2011/0143769 A1 | 6/2011 | Jones et al. |
| 2012/0052922 A1 | 3/2012 | Li |
| 2012/0115549 A1 | 5/2012 | Kim et al. |
| 2013/0154826 A1 | 6/2013 | Ratajczyk |
| 2013/0301034 A1* | 11/2013 | Olds .................. A61N 5/0618 356/51 |
| 2014/0073262 A1* | 3/2014 | Gutierrez ............ H04M 1/7253 455/67.11 |
| 2014/0162557 A1 | 6/2014 | Clayson |
| 2014/0241540 A1 | 8/2014 | Hodges et al. |

OTHER PUBLICATIONS

PCT International Search Report and Written Opinion of the International Searching Authority for International Application No. PCT/US2014/029544, mailed Aug. 28, 2014, 18 pgs.

PCT International Preliminary Report on Patentability for International Application No. PCT/US2014/029544, mailed Sep. 24, 2015, 13 pgs.

* cited by examiner

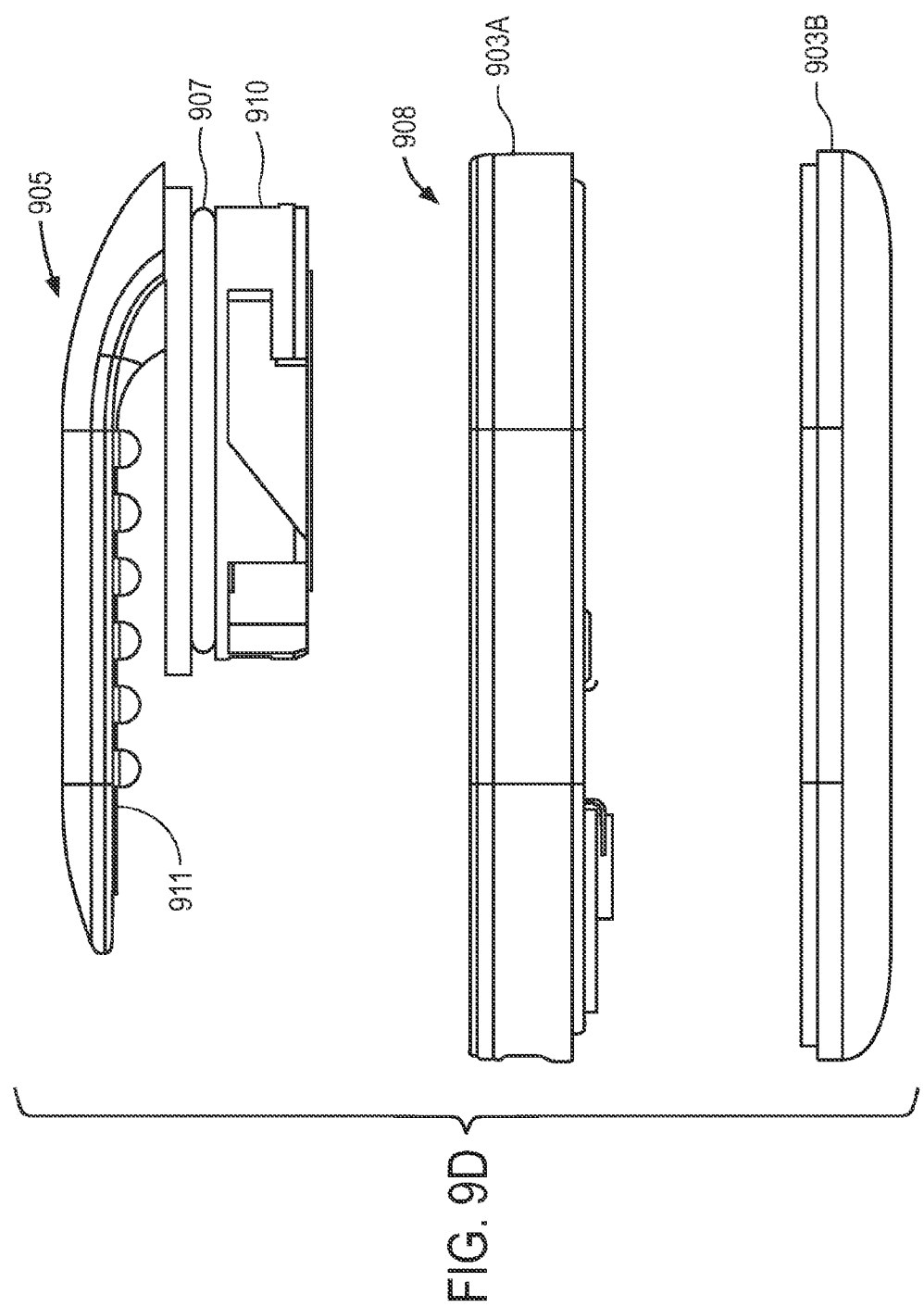

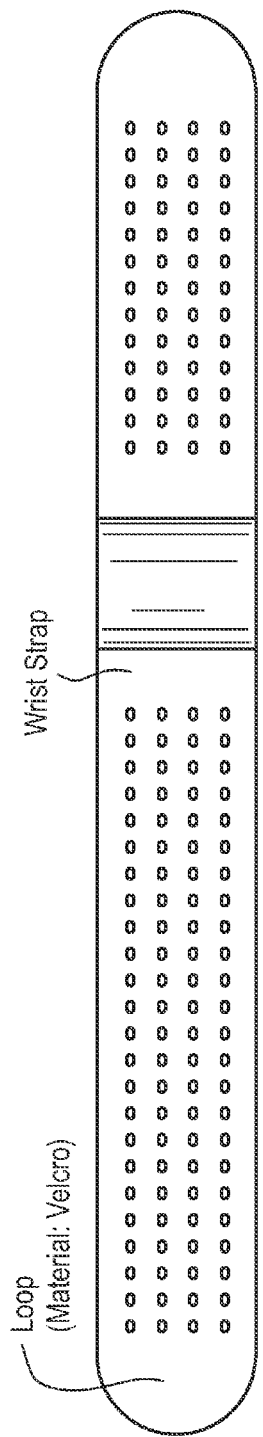
FIG. 10A (Front)
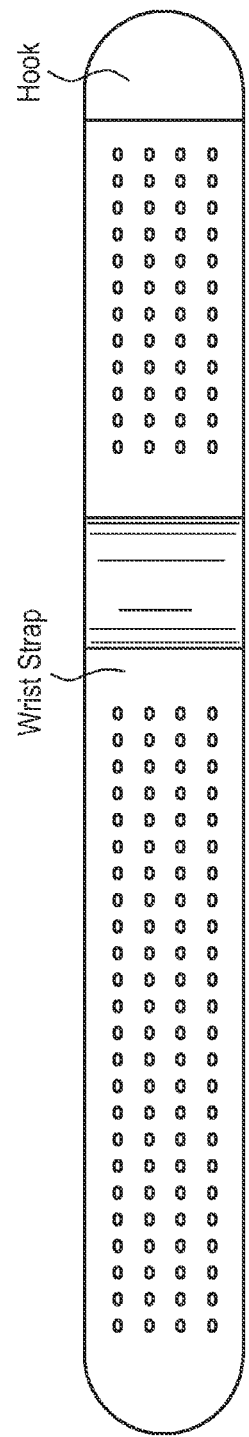
FIG. 10B (Back)
FIG. 10C (Side)

VIBRATORY ALERT DEVICE

This application claims the benefit of U.S. Provisional Patent Application No. 61/792,536 filed on Mar. 15, 2013, and this application hereby incorporates herein by reference that provisional application into this application.

BACKGROUND OF THE INVENTION

The technology described herein relates generally to electronic alert devices and more particularly to electronic alert devices that communicate with a host device, such as a cellular telephone, to provide an alert about an event or other action at the host device.

Cellular telephones, smartphones, tablet computers, wireless communication devices, etc. often use an audible signal, such as a ring tone, to indicate an incoming voice phone call or incoming text (Short Message Service or SMS) message or incoming email. These audible tones can be annoying in some cases (e.g. the ring tone occurs in a quiet concert hall) or can be difficult to hear in other cases (e.g., the tone occurs in a noisy restaurant or bar, etc.). In these cases, it is often desirable to use a vibratory alert device that can be worn closely on a user such that the vibratory alert device is close to or touching the user's skin. Vibrations from such a device can be felt by the user but can also be relatively quiet such that, from a sufficient distance from the user, the vibrations are not audible to others (or perhaps even to the user). Thus, vibratory alert devices can provide a relatively quiet alert to the user whether the user is in an environment that requires silence or is in a very noisy environment. Also, the vibratory alert device can be used in those situations in which the cellular telephone, or other device that is paired with the vibratory alert device, cannot be kept near the user (e.g., the cellular telephone or other device is in the user's purse or briefcase or backpack, etc.).

One example of a class of vibratory alert devices is the recently developed smartwatch which is an accessory of a smartphone, such as an iPhone; the smartwatch is paired to work, through Bluetooth Low Energy wireless communication, with the smartphone and provides vibratory alerts and includes a sophisticated touch based user interface that is displayed on a display device of the smartwatch. The touch screen on these types of devices is one of several input devices as they often include multiple buttons for a user to press to control or configure the smartwatch. These smartwatches are complicated and large and are worn on a user's wrist. U.S. Pat. No. 8,421,607 provides another example of a vibratory alert device.

SUMMARY OF THE DESCRIPTION

In one embodiment, a simplified Bluetooth Low Energy (BLE) compliant vibratory alert device can be paired with a host device or another device, such as a smartphone or cellular telephone or tablet computer or personal digital assistant or other wireless communication device, to provide vibratory alerts, from the host device, to a user. The vibratory alert device can, in one embodiment, use a non-rechargeable battery (such as a lithium or an alkaline coin-shaped battery) to provide power to the vibratory alert device. In one embodiment, the insertion or activation of the non-rechargeable battery in the housing of the alert device automatically causes the alert device to pair (e.g., through a conventional BLE bonding protocol or Bluetooth pairing protocol) with the host device, and after the alert device is paired, at least a portion of the alert device remains on continuously. In one embodiment, a battery monitoring circuit can monitor the state of charge of the non-rechargeable battery and can cause a wireless transceiver (for example, a BLE transceiver or Bluetooth transceiver) in the alert device to transmit one or more low battery messages to the host device or another device, and these messages can be used as a reminder to the user to replace the non-rechargeable battery. In one embodiment, the vibratory alert device has no buttons, no switches, no input devices, no display, no indicator lights, no ports, and no plugs for electrical connections; control of the alert device is provided solely by inserting or activating the non-rechargeable battery and by selecting one or more settings or options on the host device. In one embodiment, the user loads a software application on the host device which can be used to select one or more options that control how the vibratory alert device operates. For example, the vibrations from the alert device can be set so that they are substantially inaudible yet can still be felt by the user when the alert device is attached to the user's clothing or is positioned close to the user's skin. In one embodiment, the alert device is designed to be worn under the user's clothing and is hidden from view; hence, a display is not needed for this embodiment. In one embodiment, the vibratory alert device can include a spring based clip that can be used to attach the alert device to the user's clothing; in another embodiment, the vibratory alert device can be attached to straps or to a chain so that it can be worn like a watch or a necklace or an earring. In one embodiment, the vibratory alert device can have a small cylindrical shape (e.g., less than 25 mm in diameter along a cross section and be less than 5 mm in thickness) and can be waterproof or water-resistant. In another embodiment, the vibratory alert device can have a substantially oval shape and can be waterproof or water-resistant; for example, the vibratory alert device can have an oval shape that has a length in a range of about 25 to 45 mm and a width in a range of about 15 to 30 mm and a thickness in a range of about 5 to 15 mm. The oval shape can be small enough that the vibratory alert device can be clipped or otherwise attached to a user's body or clothing (or accessories such as jewelry).

In one embodiment, the non-rechargeable battery is insertable into and removable from the housing of the vibratory alert device by the user; for example, in one embodiment the housing has two portions that snap together through interlocking clasps or that screw together so that the user can insert or remove the non-rechargeable battery without any tools. In another embodiment, an interchangeable door can be removed from the housing to obtain access to a non-rechargeable battery in a battery compartment of the housing. The interchangeable door can include a first mounting surface that is complementary to a second mounting surface within the battery compartment, and the first mounting surface and the second mounting surface can form a bayonet or screw mount that is used to removably couple the interchangeable door to the housing. The interchangeable door can be part of a set of interchangeable doors, each having a different type of attachment devices (e.g. one of a clip, an eyelet, a ring, a magnet, a Velcro surface, or an alligator clip), and the user selects the interchangeable door to use based on the attachment device.

The door can also be a simple flat minimal size object, which has a slot so it can be opened with a coin. In this configuration, the device is kept to its thinnest size, so it can be comfortable in a pants pocket, or worn by placing it in a pocket of a wrist strap, or held directly to the user's skin with adhesive tape like that used for medical dressings.

In one embodiment, when the user first receives the vibrator, the non-rechargeable battery is either not electrically connected to the vibrator (for example, a plastic insulator separates one or more battery contacts from contacts in the vibrator) or is physically not in the vibrator. In order to activate the vibrator, the user either removes the insulator or inserts the non-rechargeable battery into the vibrator. The user, in one embodiment, can also load a software application on the host device (such as a smartphone) to receive the low battery message from the vibrator and to display that message (on a display of the another device such as a host device) to the user. The activation of the vibrator (e.g., by inserting the battery) will, in one embodiment, cause the vibrator to wirelessly pair or bond with the host device on which the software application has been loaded. No buttons, no switches, or other input devices on the vibratory alert device need to be pressed or used to cause the pairing in one embodiment. After the vibrator has been powered on (through the activation of the vibrator by inserting the battery), at least a portion (e.g. a timer and a wake-up circuit) of the vibrator remains always on until the battery runs out of charge (which can be about 2-6 months in the case of certain large capacity coin-shaped batteries). Prior to the battery running out of charge, a battery monitoring circuit, which is coupled to the battery and to a processing system in the vibratory alert device, detects a low battery state and causes the processing system to send a low battery message, through the wireless transceiver, to the host device which can present (e.g. display) a low battery message or warning on the host device to the user. That low battery message will cause the user to change the battery; when the battery is changed the vibratory alert device can either use stored settings for the pairing with the host device to continue the pairing or repeat the initial pairing operation again. When the host device receives a voice phone call (or other communication such as a notification), the host device transmits an alert signal to the vibratory alert device which causes the vibrator in the alert device to vibrate (thereby alerting the user about the call or other communication).

In one embodiment, the vibratory alert device can include an alarm clock functionality in which a user sets an alarm (e.g. a wake-up time or other time) on the host device through one or more apps on the host device, and the vibratory alert device vibrates at the set time. The vibratory alert device can be set (through the host device) to vibrate for only a user specified or predetermined (system) period of time (e.g. vibrate for 15 seconds and then automatically stop) or can be set (at the host device) to vibrate continuously or repeatedly and periodically (e.g. 5 seconds on, then 15 seconds off, then 5 seconds on, then 15 seconds off, etc.) until the vibrator is deactivated on the host device. In one embodiment, the vibratory alert device does not include a real-time clock and relies upon a real-time clock in the host device to keep time and to store the selected alarm time and to send a signal to cause the vibrator in the vibratory alert device to vibrate; in an alternative embodiment, the vibratory alert device can include a real-time clock with memory to store the selected alarm time so that the vibrator can vibrate at the selected alarm time without requiring the host device to cause the vibrator to vibrate.

In one embodiment, the vibratory alert device can be used as an "electronic leash", to notify the user when he has accidentally left his phone behind. When the device and the user's phone are separated by a distance that causes the two devices to be beyond Bluetooth Low Energy range (e.g. 30-200 feet), the device could vibrate. The user's phone could have settings to prevent the device from vibrating for a predetermined period of time, for example 3 minutes, to ignore a separation when a user might visit a restroom with his phone left on his desk.

In one embodiment, the vibratory alert device can have an internal component arrangement in which most of the components are not stacked one on top of another. In this arrangement, the battery and the vibrator and one or both of the printed circuit board (containing the wireless transceiver) and the antenna are not stacked but rather are arranged along a plane such that an imaginary plane can extend through the battery and the vibrator and one or both of the printed circuit board and the antenna. In one embodiment, these components in this arrangement can be contained in a housing that has an oval shape, and the housing can include an interchangeable door, through which a user can replace the battery which can be a non-rechargeable battery.

Methods for operating various alert devices are described herein, such as a method of initially pairing the alert device with the host device and a method of sending battery low messages to the another device such as the host device. This disclosure also describes various non-transitory machine readable storage media that can store computer program instructions that, when executed by a processing system, cause the processing system to perform any one or more of the methods described herein.

The above summary does not include an exhaustive list of all aspects of the present invention. It is contemplated that the invention includes all systems and methods that can be practiced from all suitable combinations of the various aspects summarized above, and also those disclosed in the Detailed Description below.

BRIEF DESCRIPTION OF THE DRAWINGS

The present invention is illustrated by way of example and not limitation in the figures of the accompanying drawings in which like references indicate similar elements.

FIG. 9D shows a side view of a vibratory alert device in a disassembled state and shows a bayonet mounting surface on the door 905.

FIG. 10A is a front view of a wrist strap, according to one embodiment, which can hold one or more embodiments of the vibratory alert devices described herein.

FIG. 10B is a back view of the wrist strap shown in FIG. 10A.

FIG. 10C is a side view of the wrist strap shown in FIG. 10A.

DETAILED DESCRIPTION

Figure 1:
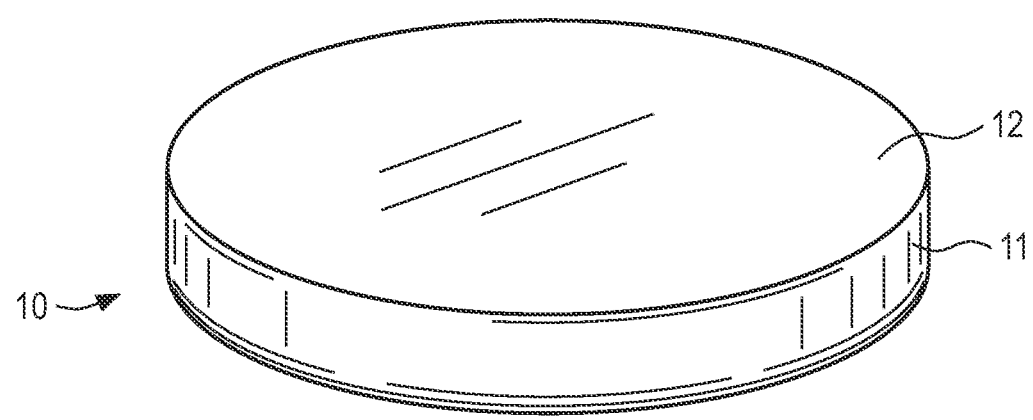
FIG. 1 shows a top perspective view of a vibratory alert device according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

In one embodiment, a vibratory alert device is a simplified and small device that can be attached to clothing or worn as a pendant (e.g., jewelry) or worn on a wrist strap on a user. It can be paired or bonded, in one embodiment, with a host device or another device, such as a smartphone, merely by inserting, or activating, a battery, such as a non-rechargeable battery, into the vibratory alert device and by using a software component on the host device to coordinate the pairing process which is initiated by inserting or activating the battery. The term "paired" is meant to include pairing under a Bluetooth protocol and also include bonding under a Bluetooth Low Energy protocol. In one embodiment, the vibratory alert device does not include any input devices or user activatable buttons or switches. Moreover, in one embodiment, the vibratory alert device does not include any ports, or plugs, or jacks, and in one embodiment includes no outputs or output devices except for the vibrator which provides the vibrations for the vibratory alert device. In an alternative embodiment, the vibratory alert device can include an optional component, such as a biosensor, within the vibratory alert device; this alternative embodiment is described further below. In one embodiment, once the non-rechargeable battery is inserted or otherwise activated in the vibratory alert device, at least a portion of the vibratory alert device remains on until the non-rechargeable battery runs out of power; in one embodiment, prior to doing so, the vibratory alert device transmits one or more battery low messages to the host device which is paired with the vibratory alert device in order to cause the host device to present an alert or warning message to the user that the battery is running low.

The vibratory alert device can take a variety of different forms, including a disc-like shape that resembles a coin or a set of coins stacked one on top of another. Alternatively, the vibratory alert device can resemble a polyhedron such as a rectangular prism or other three-dimensional shapes.

Figure 2:
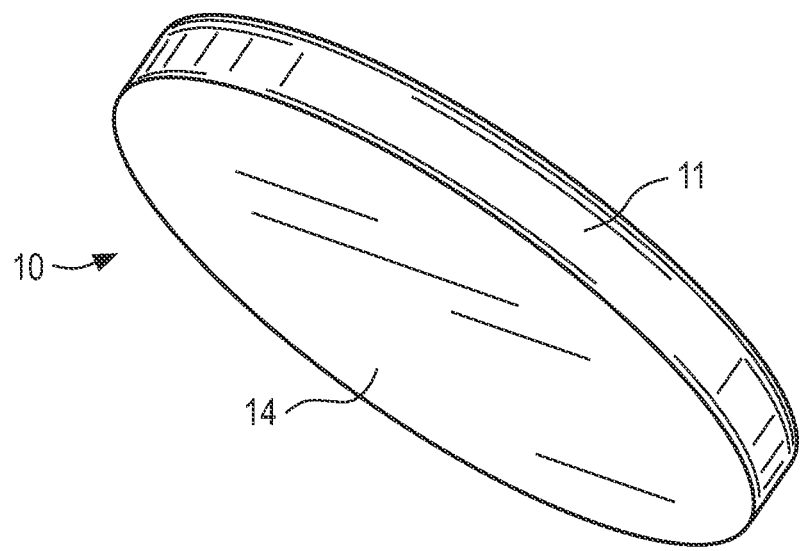
FIG. 2 shows a bottom perspective view of the vibratory alert device of FIG. 1.

FIGS. 1 and 2 show an example of one embodiment of a vibratory alert device which has a disc-like shape which can resemble a coin such as a U.S. nickel or a U.S. quarter or a stack of two nickels or two quarters, stacked one on top of the other. In one embodiment, the diameter of the disc, which has a cylindrical shape, is less than one inch and the thickness of the disc is less than about 5 mm. In another embodiment, the diameter of the disc is about 0.4-0.7 inches and the thickness of the disc is between 3 mm and 6 mm. The vibratory alert device 10 as shown in FIGS. 1 and 2 includes the top 12 and a bottom 14 and a rim or side 11 between the top 12 and the bottom 14. In one embodiment, there are no buttons, no switches, and no user activatable input devices on the vibratory alert device 10 and there is no display device and no ports, no plugs, and no jacks on the device. The device includes, in one embodiment, at least one non-rechargeable user insertable and removable battery. In one embodiment, at least one electrical component in the vibratory alert device is at least partially "on" on a continuous basis after the battery is activated or inserted into the vibratory alert device. In one embodiment, there are no outputs on the vibratory alert device 10 except for the vibrator itself. In one embodiment, the vibratory alert device 10 is waterproof or water resistant (for example, the device 10 meets the IPX-6 standard) such that the vibratory alert device is washable should the user forget to detach the vibratory alert device from the user's clothing. It will be appreciated that the embodiment of the vibratory alert device shown in FIGS. 1 and 2 can include a clip or strap or eyelet or other mechanism to allow the vibratory alert device to be attached to the user or the user's clothing. For example, the embodiment shown in FIGS. 1 and 2 can include a clip such as the clips shown in FIGS. 4A and 4B.

In one embodiment, either the top 12 or the bottom 14 is removable by the user to expose a battery compartment into which a non-rechargeable battery can be inserted or removed from the vibratory alert device 10. For example, the top 12 or the bottom 14 may be attached by clasps to the vibratory alert device, and the user can remove the top 12 or the bottom 14 in order to gain access to the battery compartment within the vibratory alert device 10. In another embodiment, the top 12 or the bottom 14 may have threads which screw into threads on the vibratory alert device to allow that component to be removed from the vibratory alert device when the user seeks to gain access to the battery compartment within the vibratory alert device 10.

In one embodiment, the top 12 and the bottom 14 are flat, smooth surfaces and the rim or side 11 is also a smooth surface. These surfaces may be fabricated from conventional plastics or other materials to provide sufficient durability for everyday use.

Figure 3:
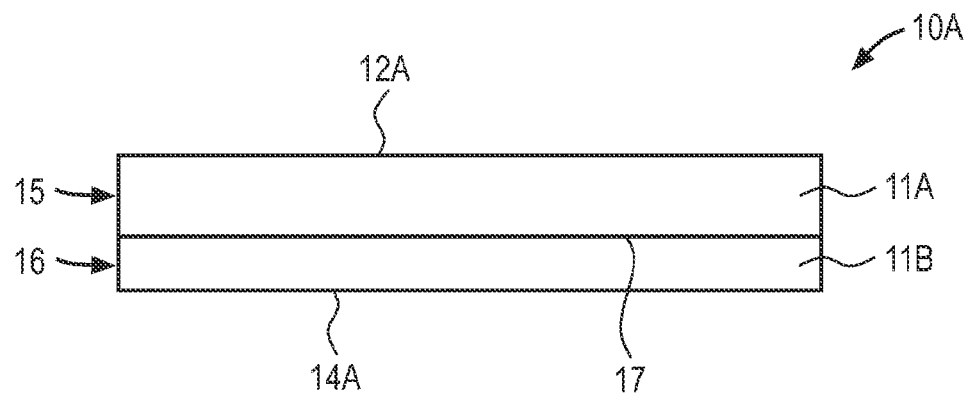
FIG. 3 shows a side view of an embodiment of a vibratory alert device according to one embodiment of the present invention.

FIG. 3 shows an alternative embodiment of a vibratory alert device 10A. The housing of the vibratory alert device 10A includes two separate portions, a first portion 15 and a second portion 16 which can screw together or snap together. When assembled, the first and second portions 15 and 16 leave a seam 17 which can, in one embodiment, be sealed with an internal gasket located internally within the housing of the vibratory alert device 10A. The vibratory alert device 10A includes a top 12A and a bottom 14A and includes two portions of the rim of the device, portion 11A and portion 11B, which together form the entire rim that separates the top 12A from the bottom 14A. In order to expose the battery compartment within the vibratory alert device 10A, the user can grasp the first portion 15 and the second portion 16 and separate the two if they snap together or unscrew the two portions to gain access to the battery compartment within the vibratory alert device 10A. Other forms of coupling the first portion 15 and the second portion 16 can also be used.

It will be appreciated that the vibratory alert devices shown in FIG. 3 can include one or more clips or straps or eyelets or other mechanisms to allow these vibratory alert devices to be attached to a user or to a user's clothing. For example, the clips shown in FIG. 4A or 4B can be used in the embodiments shown in FIG. 3 to allow the vibratory alert devices 10A and 21 to be attached to clothing of a user.

Figure 4A:
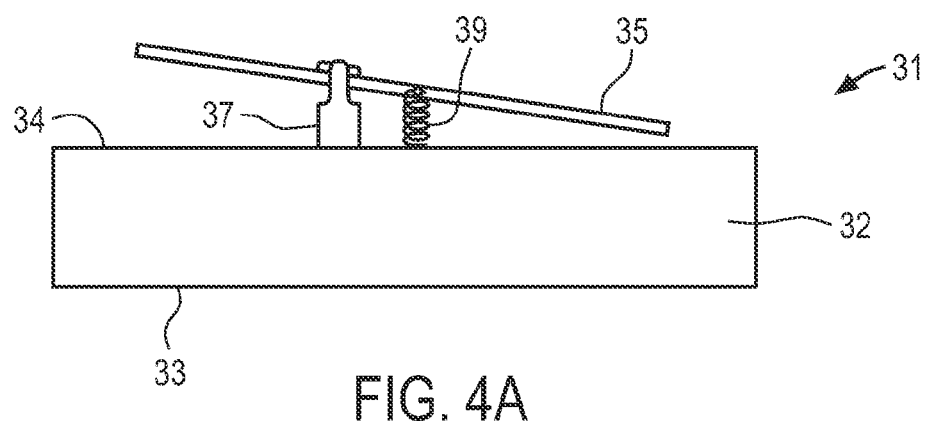
FIG. 4A shows an example of a vibratory alert device which includes an embodiment of a clip which can be used to attach the vibratory alert device to a user's clothing.
Figure 4B:
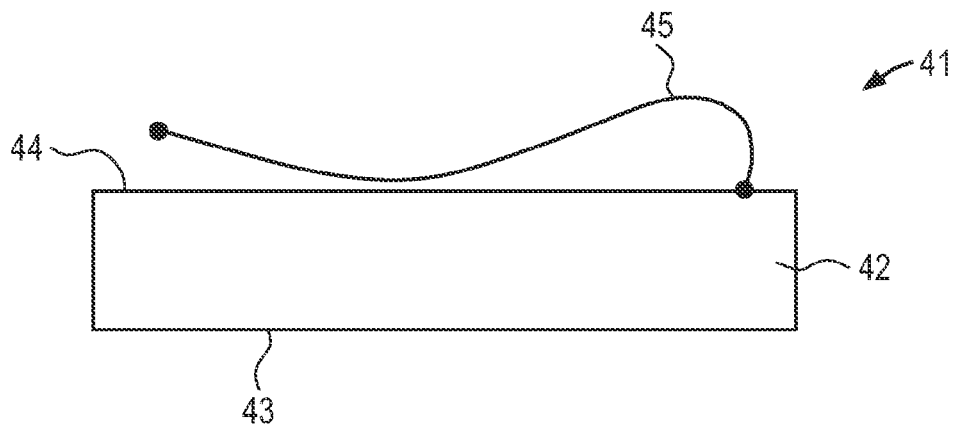
FIG. 4B shows another embodiment of a clip on a vibratory alert device which can be used to attach the vibratory alert device to clothing of a user.

FIG. 4A shows an example of a clip that can be used to attach the vibratory alert device 31 to a user's clothing. The vibratory alert device 31 includes a top 34, a bottom 33, and rim 32, and also includes a clip which includes an arm 35, a spring 39, and a post 37. The post is coupled at one end of the post to the arm 35, and the other end of the post is coupled to the top 34. The post 37 allows the arm to pivot up and down. The spring 39 pulls the arm 35 down against clothing which is tucked under the right side of the arm 35. A user can press the left side of the arm 35 to open the clip to release the clothing from the clip to remove the vibratory alert device 31 from the clothing. Similarly, the user can open the clip to allow the vibratory alert device 31 to be attached to the clothing by pushing down on the left side of the arm 35 which opens a gap between the right side of the arm 35 and the top 34 to allow the clothing to be inserted into that gap, and then the user can release the left side of the arm, and the spring 39 will pull the right side of the arm 35 back down towards the clothing to lock the vibratory alert device onto the clothing. FIG. 4B shows an alternative embodiment of a clip 45, which can be a piece of metal attached at one end to a portion of the top 44 of the vibratory alert device 41. The metal of the clip 45 can be a resilient spring which in its natural state presses against the top 44 or is positioned close to the top 44. A user can insert clothing between the clip 45 and the top 44 and the clip 45 will secure the clothing against the top 44 to hold the vibratory alert device 41 onto the clothing of the user. The vibratory alert device 41 includes a top 44 and a bottom 43 and a rim 42 and can have a disc-like shape such as the alert devices shown in FIGS. 1 and 2. It will be appreciated that alternative mechanisms for attaching the vibratory alert device to clothing or to other parts of the user may be used, such as eyelets, or straps, or magnets, or Velcro, etc. If the vibratory alert device includes straps, the user may be able to wear the vibratory alert device on the user's wrist to use as a wake-up alarm.

Figure 5A:
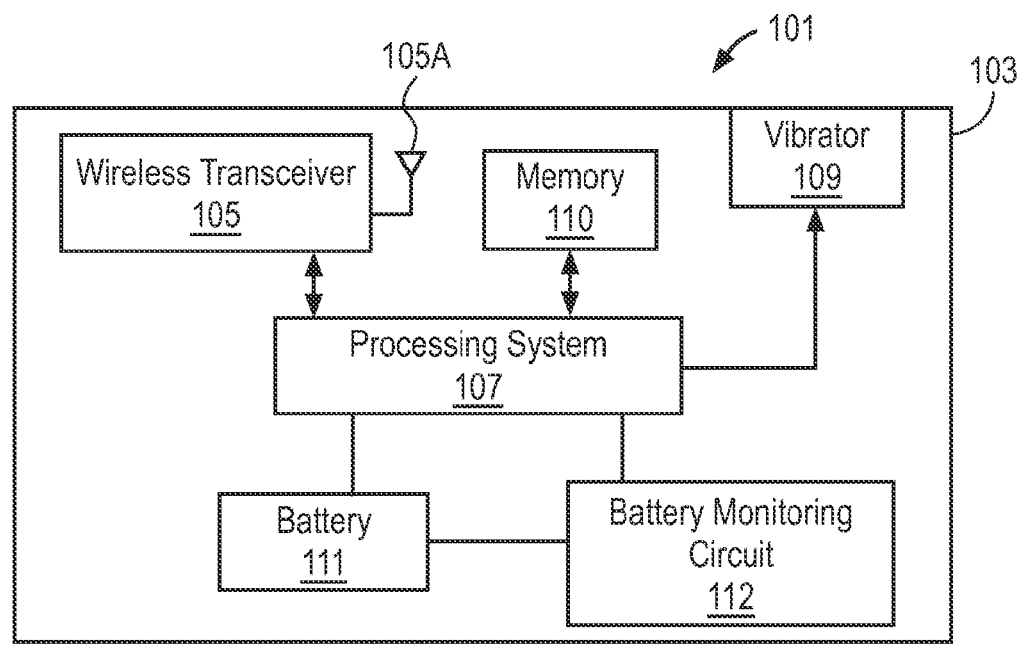
FIG. 5A shows an example of the components which can be part of a vibratory alert device according to one embodiment of the present invention.

FIG. 5A shows an example of a vibratory alert device 101 which includes a housing 103 which can be any one of the housings shown in FIGS. 1, 2, 3, 4A, 4B, 8A, and 9A-9E. The housing 103 can take a substantially cylindrical or disc-like shape or an oval shape or other three-dimensional shapes such as a polyhedron. The housing 103 can contain, within the housing, a plurality of components such as a processing system 107, a memory 110, a vibrator 109, a wireless transceiver 105, an antenna 105A, a battery 111, which can be a non-rechargeable battery which is insertable and removable by the user, and a battery monitoring circuit 112. The processing system 107 can be a low power microcontroller or microprocessor which is configured to operate in the manner described herein to control the vibrator 109 to which it is coupled and to send and receive signals through the wireless transceiver 105 which communicates with a host device or another device, such as a smartphone, cellular telephone, personal digital assistant, or other wireless communication device. In one embodiment, the wireless transceiver 105 is a Bluetooth Low Energy transceiver which is configured to operate in compliance with the Bluetooth Low Energy protocol or standard to communicate with other Bluetooth Low Energy components. In one embodiment, the vibratory alert device 101 operates as a Bluetooth Low Energy peripheral which can be paired with a smartphone using the Bluetooth Low Energy protocols. In another embodiment, the wireless transceiver 105 can be other types of wireless transceivers that can operate in a network, such as a personal area network or in a peer-to-peer manner. The antenna 105A sends and receives signals to provide communication with the host device which can be a smartphone, a cellular telephone, personal digital assistant, tablet computer, etc. or other wireless communication device. The host device can provide commands to select options, which are described below, and will participate in the pairing or bonding process with the vibratory alert device in order to establish a pairing or bonding, as is known in the art, between the vibratory alert device and the host device. The memory 110 is coupled to processing system 107 and stores data for the processing system and computer code, in certain embodiments, to allow the processing system to operate in the manner and methods described herein. In one embodiment, the memory 110 can store the settings for the pairing or bonding between the vibratory alert device 101 and the host device and can also store the selected options such as one or more different manners of vibrating (see, for example, operation 705 in FIG. 7). Memory 110 can include both volatile RAM (e.g., SRAM) and non-volatile memory, such as flash memory. The non-volatile memory can store the pairing settings indicating the pairing data to allow the vibratory alert device 101 to pair and operate in the paired mode with the another device, such as a host device. The processing system 107 is coupled to the vibrator 109 to control the operation of the vibrator. The processing system 107 controls when the vibrator is turned on and when the vibrator is turned off as well as the types of vibrations based upon the selected options stored in memory 110. The battery 111 is coupled to the processing system and to other components to provide power to the various components of the vibratory alert device 101. For example, the battery provides power to the wireless transceiver 105, the processing system 107, memory 110, battery monitoring circuit 112, and the vibrator 109. The status of the battery's charge is monitored by the battery monitoring circuit 112 which can be a conventional battery monitoring circuit that provides an output to the processing system 107 to indicate when the battery becomes low, such as when the charge level of the battery drops below a predetermined threshold. The battery monitoring circuit 112 is coupled to the battery 111 to measure the battery's charge level and provides an output to the processing system 107 to indicate when the battery 111 falls below a charge level. In this manner, the battery monitoring circuit 112 can cause the processing system to send a low battery message to the host device or another device through the wireless transceiver 105 and the antenna 105A. This transmission of the low battery message can occur periodically and repeatedly until the battery 111 is replaced by the user. The various components in the vibratory alert device 101 may be coupled, as is known in the art, through one or more buses or other interconnect systems to allow for the processing system 107 to send and receive data and communications through the wireless transceiver 105 and to control the vibrator 109 and to receive signals from the battery monitoring circuit 112. In one embodiment, the wireless transceiver 105, the processing system 107, the memory 110 and the battery monitoring circuit 112 can all be implemented as part of a single System-on-Chip (SOC) Integrated Circuit (IC) which consumes very little power most of the time because only a small portion is always on continuously. In one embodiment, the alert device has no buttons and no user activatable switches and thus is cannot be turned on or off by a button or switch and hence a small portion remains always on continuously. That small portion can be a timer circuit that periodically and repeatedly turns off most of the processing system 107 and turns off the transceiver 105 for a period of time and then wakes up (powers up) these components which determine whether the host device is communicating with the alert device, and if the host device is not communicating with the alert device, then the timer circuit returns most of the processing system 107 and the transceiver 105 to a powered down state, and this cycle repeats unless the alert device is communicating with the host device and/or operating the vibrator (after which it will resume this cycle of sleep (low power) and wake up). In one embodiment, the SOC IC can be configured to operate according to the Bluetooth Low Energy standard or protocol; when bonding is performed according to this protocol, the alert device remains in a bonding mode for a predetermined period of time after the battery is activated.

The vibratory alert device 101 shown in FIG. 5A can be similar to the vibratory alert device 10 shown in FIGS. 1 and 2 in that, in one embodiment, it does not include an on/off switch and does not include any user buttons or switches and does not include any input device. Further, there is no plug and no port (such as a USB port) and no jacks and no recharging port or jack or plug. Further, in one embodiment, there is no output device other than the vibrator 101 which can, in one embodiment, be directly coupled to or connected to the housing 103 such that vibrations created by the vibrator 109 are directly imparted on the housing 103 to cause the housing 103 to vibrate according to the pattern of vibration provided by the vibrator 109. The vibratory alert device 101 in FIG. 5A can also be waterproof or water resistant, and this can be achieved by using known conventional techniques such as sealing gaskets or sealing materials, such as sealing materials from Gore-Tex from W. L. Gore and Associates of Newark, Del. For example, all the components shown in FIG. 5A can be incorporated into a sealed compartment which is sealed by ultrasonic welding or other sealing methods or materials, while the battery can be located in a separate section which is kept waterproof by a door with a gasket, such as an O-ring. In another embodiment, sealing gaskets may provide an enclosed chamber which sufficiently seals the chamber from ambient water, etc.

Figure 5B:
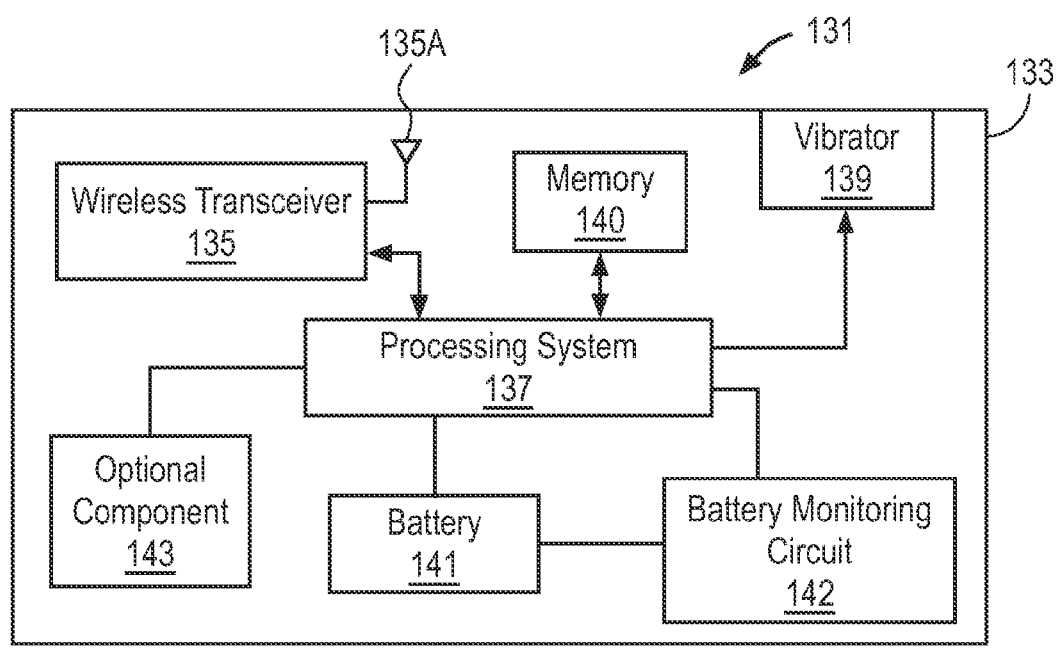
FIG. 5B shows an example of the components which can be part of a vibratory alert device according to another embodiment of the present invention.

FIG. 5B shows another embodiment of the present invention. In particular, FIG. 5B shows a vibratory alert device 131 which includes one or more optional components 143. In one embodiment, the vibratory alert device 131 can be identical to, in structure and function and operation, the vibratory alert device 101 except for the inclusion of the optional component 143. In one embodiment, the optional component can be a biometric sensor (e.g. blood pulse sensor) that collects data that is transmitted to the host device, or the optional component can be another type of sensor such as an accelerometer, etc. In one embodiment, the optional component 143 can be clock circuitry and a low power display, such as a bistable liquid crystal display device which shows the time of day on a face or surface of the vibratory alert device. The device 131 can include a wireless transceiver 135 which is similar to the wireless transceiver 105 and an antenna 135A which is similar to the antenna 105A. Similarly, the memory 140 and the processing system 137 can be similar to the memory 110 and the processing system 107. Battery 141 can operate in a similar manner as battery 111, and the battery monitoring circuit 142 can operate in a similar manner as battery monitoring circuit 112. The optional component 143 can receive its settings and control through the wireless connection provided by the wireless transceiver 135 and the antenna 135A. For example, the clock can be set on the host device by providing the time of day from the host device to the clock circuitry in the vibratory alert device 131, or time from the host device itself can be transmitted periodically over time from the host device to the vibratory alert device 131 which can be used to set time in the clock circuitry of the optional component 143. The clock circuitry can maintain the time when connection is lost with the host device so that the device 131 can function as a standalone clock or alarm clock.

In one embodiment, a vibratory alert device can include an alarm clock (or timer) functionality in which a user sets an alarm (e.g. a wake-up time or other time) on the host device through one or more apps on the host device, and the vibratory alert device vibrates at the set time. For example, the user can use an app created by the entity that designed or created the vibratory alert device to set a wake-up or other time on the host device; the app is installed by the user and runs on the host device. In another embodiment, the user can use a default or system app that already exists on the device (such that the user does not need to install an app created for the vibratory alert device) in order to set a wake-up or other time. The vibratory alert device can either use the real-time clock in the host device or use a real-time clock in the vibratory alert; in most cases, using the real-time clock (RTC) in the host device is preferred. In the case where the RTC in the host device is used to keep track of the alarm (or timer), the host device will store the alarm (or other) time and send a signal to the vibratory alert device to cause it to vibrate; in this case, there is no need for an RTC in the alert device. The host device can send one or more signals over time to cause the vibratory alert device to vibrate repeatedly or periodically or continuously until the alarm is turned off (deactivated) by the user through the user's input on the host device (e.g. the user touches an icon on a screen of the host device to turn off the alarm or presses a button on the host device to turn off the alarm, etc.). How the vibrator vibrates (e.g. how long; whether it is repeated; interval between repeated vibrations) can be set on the app which the user used to set the alarm time. In the case where the vibratory alert device includes an RTC that can provide alarm clock functionality, the host device can receive the user's selection of a wake-up time and optionally the user's selection of other options (e.g. how the vibrator vibrates at the selected time) and transmit those selections to the vibratory alert device which can store those selections and operate the alert device to vibrate at the selected time. When using the vibratory alert device as a wake-up alarm, a user could wear a wrist band or strap, such as the wrist strap shown in FIGS. 10A, 10B, and 10C, which can include a pocket (such as the pocket shown in the side view of FIG. 10C) to comfortably hold the vibratory alert device. The strap shown in FIGS. 10A-10C can be made from polyester and be about 25 mm wide and about 225 mm in length and include Velcro materials for attaching the two ends to each other.

Figure 6:
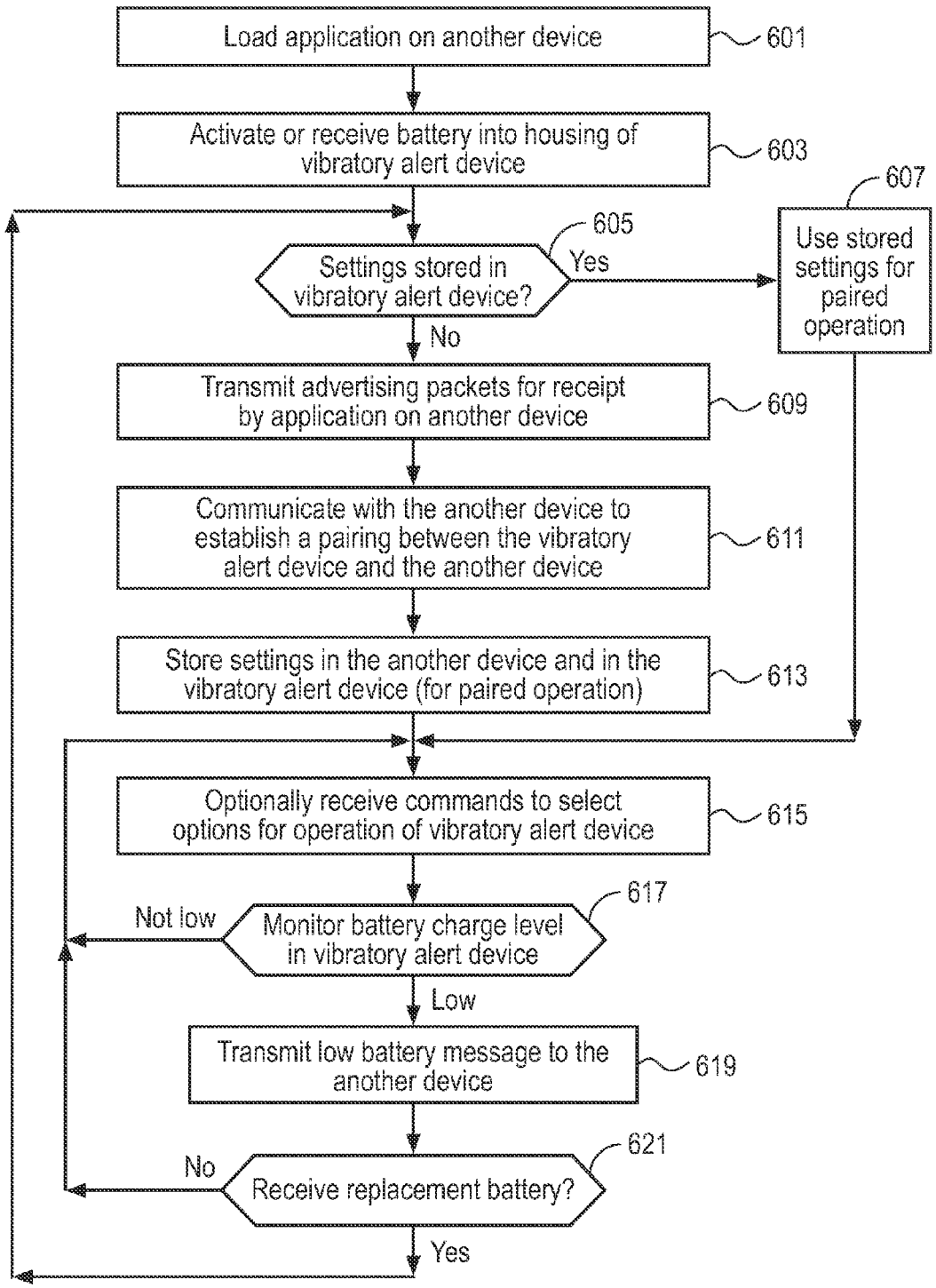
FIG. 6 is a flow chart which illustrates one method according to an embodiment of the present invention for using a vibratory alert device.

FIG. 6 shows a method according to one embodiment which can be used to initialize or set up a vibratory alert device according to one or more embodiments of the present invention. The method of FIG. 6 can be used with any of the vibratory alert devices and can be implemented by a processing system, such as processing system 107, which performs a method provided by computer program instructions stored in a non-transitory computer readable medium, such as memory 110 or memory 140. While FIG. 6 shows certain operations in a particular sequence, it will be appreciated that alternative sequences of operations can also be performed. In operation 601, a software application can be loaded on the host device or the another device, such as a smartphone. This software application can be configured to initialize and pair with the vibratory alert device and to provide for a user interface to allow the user to select options for the vibratory alert device. This software application is normally required to be set in a pairing or bonding mode when the battery is activated in the alert device. In operation 603, the user can activate or place the battery into the housing of the vibratory alert device. Operation 603 can precede operation 601 in certain embodiments. The activation or placement of the battery into the housing of the vibratory alert device will then invoke a series of operations to initialize the vibratory alert device so that it can be paired or bonded with the host device. Following operation 603, the vibratory alert device determines whether or not settings for pairing or bonding with the host device have been stored in memory of the vibratory alert device. If the result of this test in operation 605 indicates that settings have been stored, then operation 607 follows operation 605. In operation 607, the previously stored settings for paired operation between the vibratory alert device and the host device will be used for future operations. On the other hand, if previously stored settings do not exist in the vibratory alert device, then processing proceeds to operation 609 in which the vibratory alert device, such as vibratory alert device 101, transmits advertising packets to establish a paired mode of operation between the vibratory alert device and the host device. These advertising packets can comply with Bluetooth Low Energy protocols. In one embodiment, these advertising packets can be filtered by received signal strength indicators as is known in the art and can be filtered by identifiers of manufacturers so that the application loaded and running (in a pairing or bonding mode) on the host device will look for only those units specifying a certain type of vibratory alert device and which are sufficiently close based upon the received signal strength indicator. The transmission of the advertising packets from the vibratory alert device allows for the establishment of a pairing or paired mode of operation between the vibratory alert device and the host device; after an exchange of information in operation 611, the two devices can be paired together for future operation as is known in the art. Then, in operation 613, the settings for a paired mode of operation can be stored in non-volatile memory in both the vibratory alert device and in the host device, which can be a smartphone. Processing can then proceed to operation 615, which may be optional, and in which the vibratory alert device receives commands to select one or more options for operation of the vibratory alert device. Examples of such operations or options are provided in conjunction with operation 705 shown in FIG. 7. These options can include which types of communications cause the activation of the vibrator in the vibratory alert device, the type of vibrations provided by the vibrator when it is activated, the pattern of the vibrations, and other features of controlling the vibrator. For example, one set of options which a user can select may include selecting an option which provides for vibrations only in the case of text communications and voice phone call communications but no vibrations for other types of communications, such as email. Moreover, the options can include selecting different patterns of vibrations for different types of communications. For example, the user can select slow vibrations for text communications and fast vibrations for voice phone call communications, etc. The commands received in operation 615 may also include commands for setting the optional clock described in conjunction with vibratory alert device 131 or other commands for setting various parameters for operation of the vibratory alert device. In operation 617, the vibratory alert device monitors the battery charge level. This operation can occur repeatedly over time by the battery monitoring circuit such as battery monitoring circuit 112 or battery monitoring circuit 142 periodically checking the state of the charge of the battery to determine whether or not the battery's charge has fallen below a predetermined threshold. If the battery has not fallen below that threshold, then processing returns to operation 615; otherwise, if the battery charge level has fallen below that predetermined threshold, then processing proceeds to operation 619 in which the processing system, in response to receiving the battery low message from the monitoring circuit, such as battery monitoring circuit 112, causes a message to be transmitted through the wireless transceiver, such as wireless transceiver 105, to the host device or another device to cause the host device or another device to present a battery low message to the user to cause the user to replace the battery in the vibratory alert device. The transmission of the low battery message can occur repeatedly over time until a replacement battery is received, as shown in FIG. 6. In particular, following operation 619, the system determines whether or not a replacement battery has been received (operation 621). If it has not, processing reverts back to operation 615. On the other hand, if a replacement battery has been received, then processing reverts back to operation 605 and continues thereon.

Figure 7:
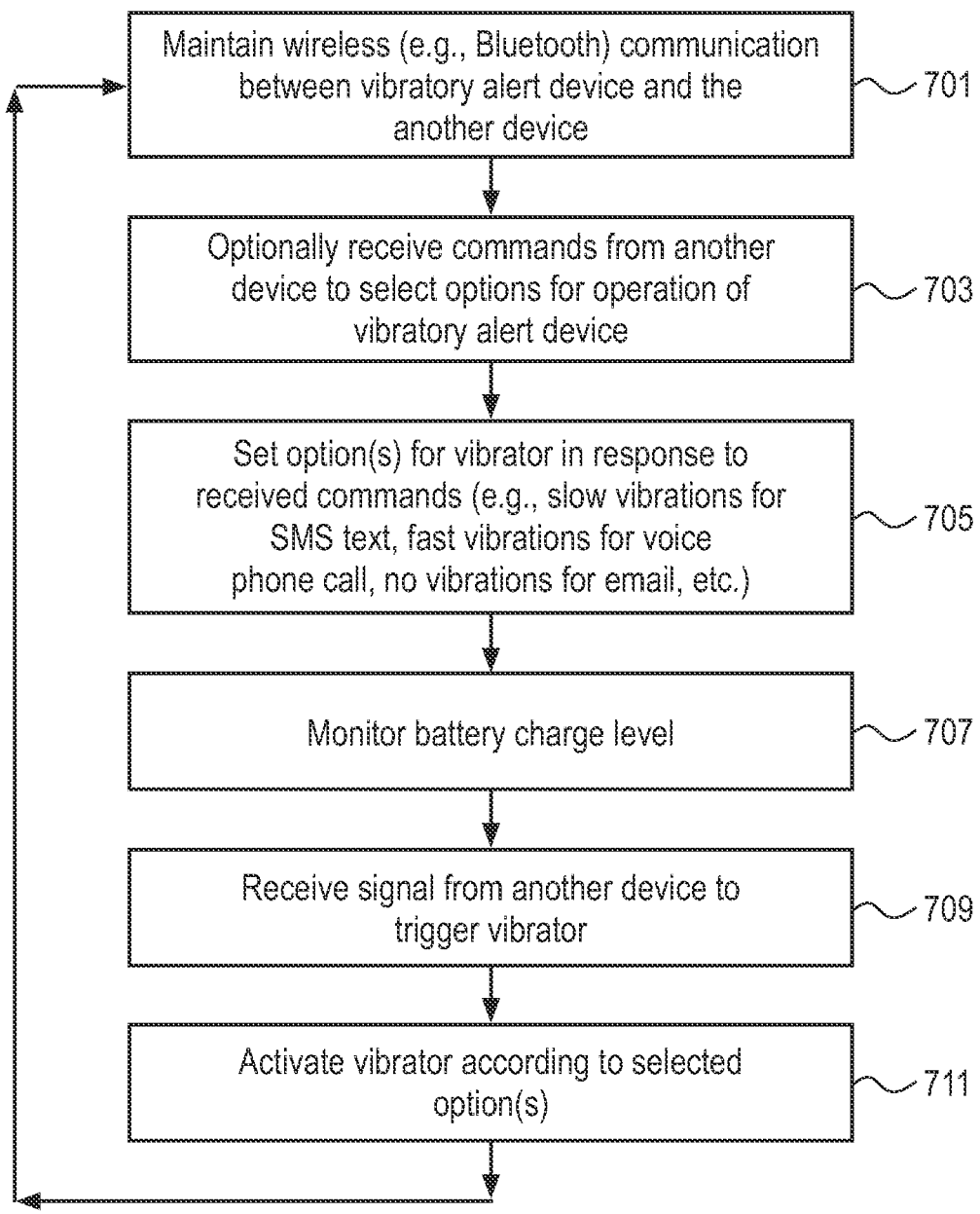
FIG. 7 is a flow chart which illustrates another method according to the present invention for using a vibratory alert device.

FIG. 7 shows a method according to one embodiment for operating a vibratory alert device, such as the vibratory alert device 101 or the vibratory alert device 131. In operation 701, the vibratory alert device maintains a wireless communication between the vibratory alert device and the host device, which can be a smartphone or other wireless communication device. As noted above, the vibratory alert device is typically (most of the time when not vibrating or pairing) in a very low power mode in which a small portion of the SOC IC is on (drawing power) and the rest of the SOC IC is off; the small portion includes a timer circuit which periodically and repeatedly wakes up the rest of the processing system and wakes up the transceiver to determine if any communications from the host device are being received, and if no communications are being received, the processing system and the transceivers are turned off while the timer circuit remains on so that it can repeat this process of waking up and then powering down the rest of the system. The wireless communication can be through a conventional Bluetooth or a Bluetooth Low Energy protocol as is known in the art. In operation 703, the vibratory alert device can receive optional commands from the host device to select options for operation of the vibratory alert device. These options can include selecting which types of communications will cause vibrations and which communications will not cause vibrations and these options can also include the pattern or types of vibrations applied by one or more vibrators of the vibratory alert device. In addition, these commands can also include time to be used to set a clock circuit in the case of the embodiment shown in FIG. 5B which can include an optional clock and bistable liquid crystal display device or other display device used to display time on a surface of the vibratory alert device. In operation 705, a processing system within the vibratory alert device can set the options for the vibrator in response to the received commands which were received in operation 703. For example, the commands may indicate that slow vibrations are to be provided for a text message while fast vibrations are to be provided for a voice phone call, while no vibrations are to be provided for an email, etc. Operation 707 can include monitoring of the battery charge level. These operations are further described in conjunction with FIG. 6 and will typically be performed over time in order to check the battery level of the device and in order to provide a signal to the host device to cause a reminder to be presented to a user to cause the replacement of the battery in the vibratory alert device. When a communication is received at the host device, the host device will cause a signal to be sent to the vibratory alert device to trigger the vibrator in operation 709 which will in turn cause the vibrator to be vibrated according to one or more selected options in operation 711. The vibratory alert device can be programmed and controlled from the host device without having any user input devices, such as user buttons or a touch screen, etc. on the vibratory alert device yet, the vibratory alert device can still be set up to be programmed through the host device.

Figure 8A:
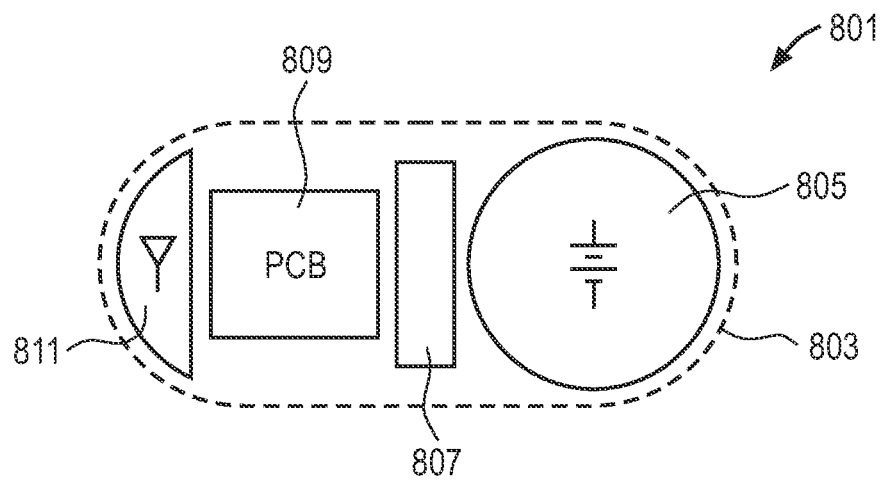
FIG. 8A shows a top plan view of an embodiment of a vibratory alert device that uses a non-stacked arrangement of components within the housing of the vibratory alert device.
Figure 8B:
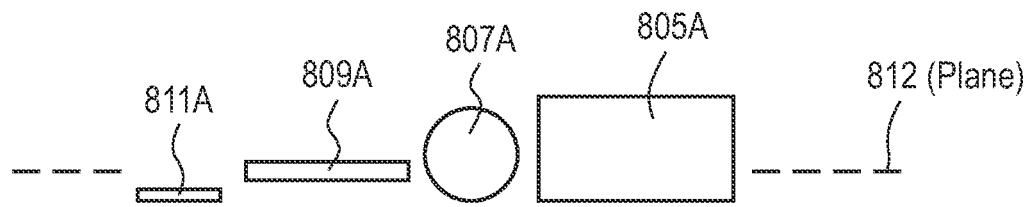
FIG. 8B shows a side view of an embodiment of a vibratory alert device that uses a non-stacked arrangement of components within the housing of the vibratory alert device.
Figure 8C:
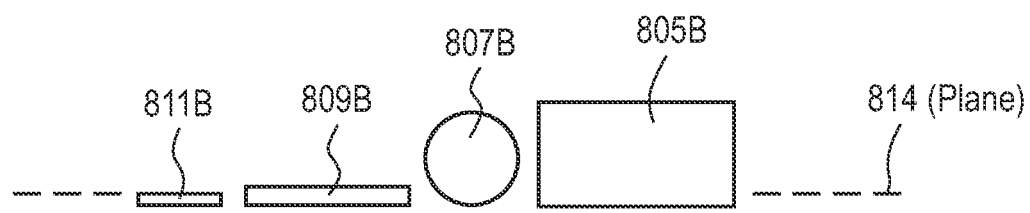
FIG. 8C shows a side view of an embodiment of a vibratory alert device that uses a non-stacked arrangement of components within the housing of the vibratory alert device.

In one embodiment, a vibratory alert device can have an internal component arrangement in which most (or all) of the components are not stacked one on top of another. Rather, the components are laid out or arranged along an imaginary plane; this arrangement can reduce the thickness of the vibratory alert device (relative to another vibratory alert device that uses a stacked arrangement). In one embodiment of the non-stacked arrangement, the battery and the vibrator and one or both of the printed circuit board (containing the wireless transceiver such as wireless transceiver 105) and the antenna (such as antenna 105A on a substrate) are not stacked but rather are arranged along a plane such that an imaginary geometric plane can extend through the battery and the vibrator and one or both of the printed circuit board (PCB) and the antenna. In one embodiment, these components in this non-stacked arrangement can be contained in a housing that has an oval shape, and the housing can include a modular door system that includes a set of interchangeable doors (such as the interchangeable doors shown in FIGS. 9A-9D) through which a user can replace the battery by opening the particular door that is attached to the housing. FIGS. 8A-8C show examples of vibratory alert devices with non-stacked arrangements. As shown in the top plan view of FIG. 8A, battery 805, vibrator 807, PCB 809, and antenna 811 are not stacked but are arranged along a plane within housing 803 (shown by a dashed oval); the connections between the components in the vibratory alert device 801 are not shown in FIG. 8A but it will be understood that such connections are present (such as the electrical connections shown in FIG. 5A). FIG. 8B shows a side view of an embodiment of FIG. 8A. In the vibratory alert device of FIG. 8B, an imaginary plane 812 extends through battery 805A and vibrator 807A and PCB 809A, but does not extend through antenna 811A. In one embodiment, the imaginary plane is substantially parallel with the top and bottom surfaces (which may include slight curved surfaces) of the housing of the alert device, and the housing can have a substantially oval shape, such as the oval shape of housing 803 in FIG. 8A. The batteries 805, 805A and 805B can be conventional non-rechargeable coin-shaped batteries that are user replaceable by opening/removing a door on the housing (see, for example the embodiments shown in FIGS. 9A-9E); these batteries can have a top and bottom surface with a rim between those surfaces, and the top surface can be a positive electrode of the battery and the bottom surface can be a negative electrode of the battery, and the plane extends between those surfaces and is parallel to those top and bottom surfaces. In the example shown in FIG. 8B, none of the components are stacked or overlap (from a top plan view or the side view shown in FIG. 8B), but in an alternative embodiment, the antenna 811A and PCB 809A can be stacked or at least partially overlap (for example, by sliding the antenna 811A under the PCB 809A). FIG. 8C shows a side view of another embodiment of FIG. 8A. In the vibratory alert device of FIG. 8C, an imaginary plane 814 extends through all four components (the battery 805B, vibrator 807B, PCB 809B and antenna 811B). In one embodiment, the imaginary plane 814 is substantially parallel with the top and bottom surfaces of the housing of the alert device, and the housing can have a substantially oval shape (such as the housing 803).

Figure 9A:
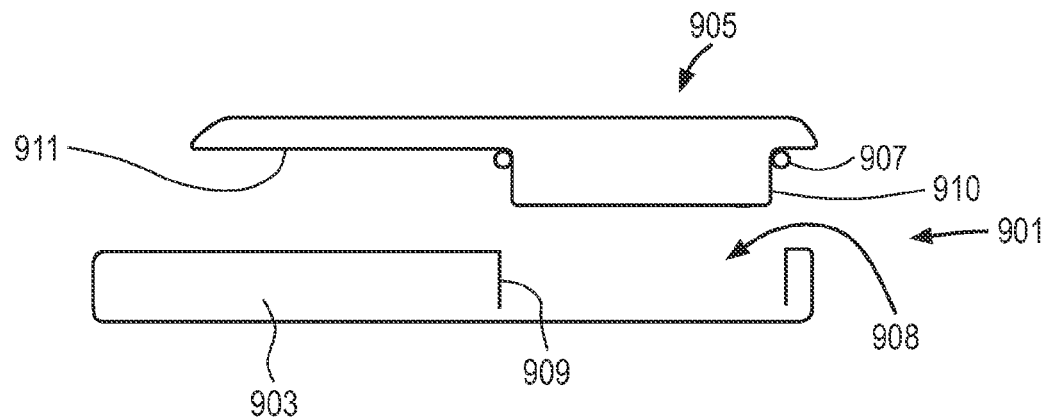
FIG. 9A shows a cross-sectional view of a vibratory alert device in a disassembled state in which an embodiment of an interchangeable door has been removed from the housing of the vibratory alert device.
Figure 9B:
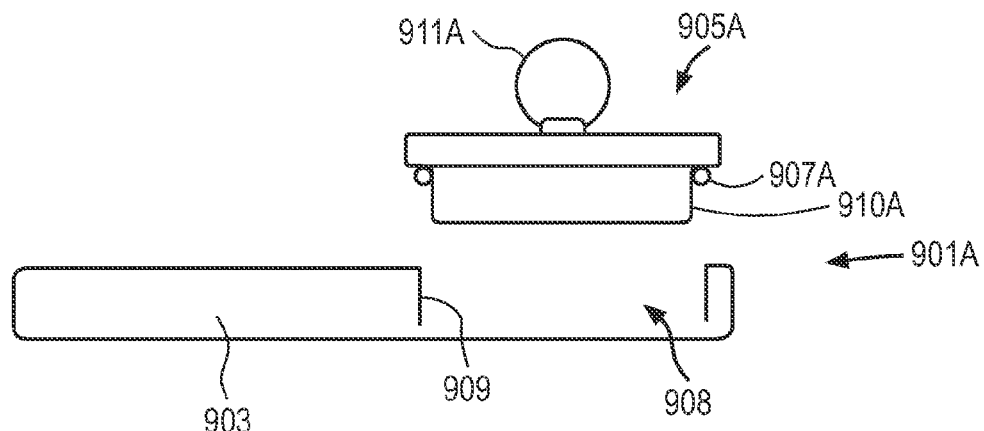
FIG. 9B shows a cross-sectional view of a vibratory alert device in a disassembled state in which another embodiment of an interchangeable door has been removed from the housing of the vibratory alert device.
Figure 9C:
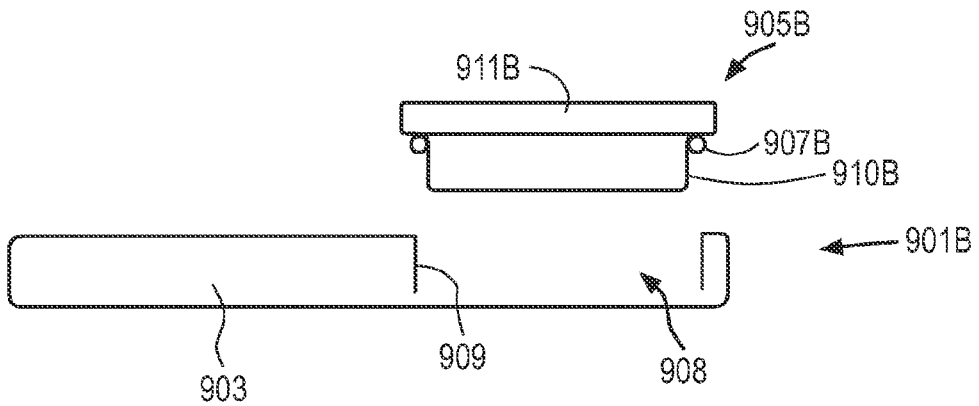
FIG. 9C shows a cross-sectional view of a vibratory alert device in a disassembled state in which another embodiment of an interchangeable door has been removed from the housing of the vibratory alert device.
Figure 9E:
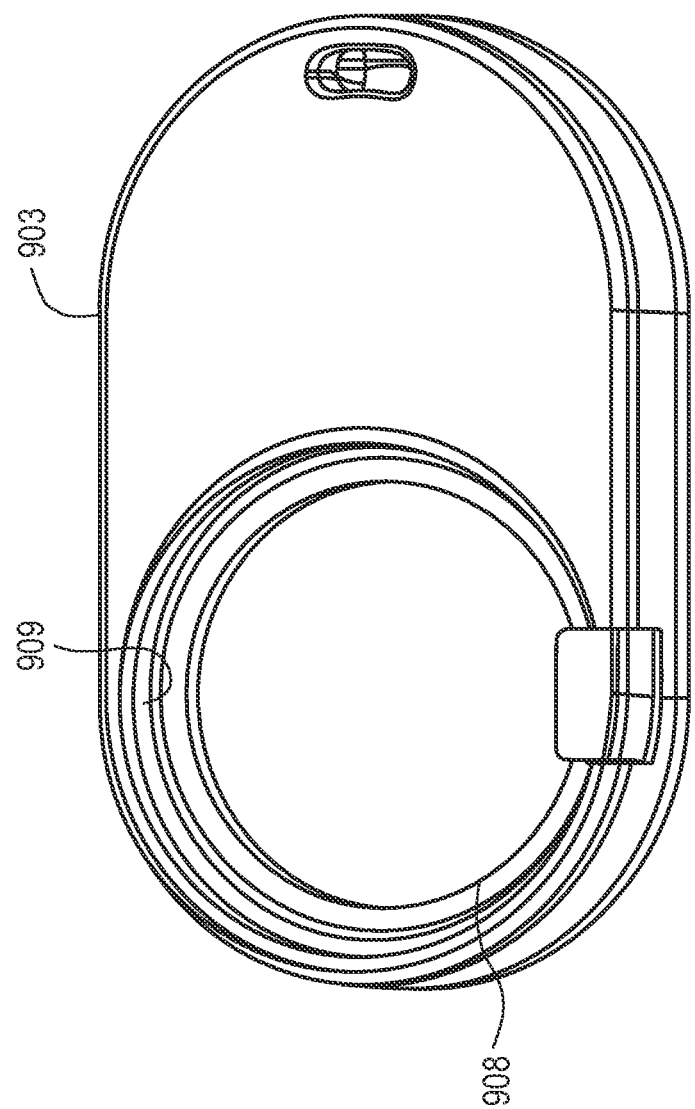
FIG. 9E is a perspective view of an embodiment of a vibratory alert device and shows the overall oval shape of the device and the battery compartment; the interchangeable door (not shown) has been removed from the device, thereby exposing the battery compartment.

FIGS. 9A-9E show examples of a modular battery door system in which a set of interchangeable doors, such as doors 905, 905A, and 905B can attach to the same bayonet (or screw) mount surface 909 in housing 903, and each interchangeable door in the set can have a different attachment device to allow the user to pick a particular attachment device, depending on the user's needs. Each of the interchangeable doors includes one of the different attachment devices which can be any one of: a clip (e.g. clip 911); an eyelet (e.g. eyelet 911A); a ring; a magnet or ferrous disk (e.g. magnet 911B); a Velcro surface; an alligator clip, etc. Each of the interchangeable doors includes a mounting surface (such as mounting surfaces 910, 910A, and 910B) which forms a bayonet (or screw) mount with a corresponding mounting surface 909 within the battery compartment 908 of the housing 903. The bayonet (or screw) mount removably couples the door (e.g. door 905 or door 905A or door 905B) to the housing 903 and allows the user to remove the door and insert a battery into the battery compartment 908 in the housing 903. Each of the interchangeable doors, such as doors 905, 905A, and 905B can include ring gaskets, such as gaskets 907, 907A, and 907B, that provide water-resistant or waterproof protection of the battery compartment. As shown in FIG. 9D, the housing 903 can be formed from two parts 903A and 903B which can be ultrasonically welded together. Each of the vibratory alert devices 901, 901A and 901B can use the non-stacked arrangement described herein (see for example FIGS. 8A-8C). The modular door system provides the functionality of allowing a battery to be inserted and/or replaced while also giving the user a variety of different attachment devices that can be used interchangeably with the same housing.

In one embodiment, a vibratory alert device can be configured to vibrate for a period of time (e.g. 15 seconds) after detecting that it has lost its wireless (radio) connection with the host device, and the host device can also be configured to provide an alert of the lost connection.

In one embodiment, a vibratory alert device can be paired with two or more host devices (e.g. a primary and a secondary) and the secondary host device can, upon detecting the presence of the alert device, cause a message to be sent to the primary host device that the presence of the alert device has been detected by the secondary host device.

It will be understood that one or more embodiments described herein can be implemented through the use of computer program instructions which are stored on a non-transitory machine or computer readable storage medium which store executable program instructions that cause one or more processors, such as processing system 107 or processing system 137, to perform one or more of the methods described herein.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A vibratory alert device, for use with a host device, the vibratory alert device comprising:
    a battery;
    a vibrator;
    an antenna;
    a printed circuit board (PCB) which includes a wireless transceiver that is coupled to the battery and to the vibrator and to the antenna;
    a housing that contains the vibrator, the PCB, the antenna and includes a battery compartment;
    a modular battery door system configured to receive a set of removable and interchangeable doors for the battery compartment, the set of doors including a first door and a second door, the first door including a first attachment mechanism and the second door including a second attachment mechanism that is different than the first attachment mechanism, wherein the first door and the second door are selected for use based on a desired attachment mechanism; and
    wherein the battery, the vibrator, and the PCB have a non-stacking arrangement such that a plane extending through the battery's housing also extends through the vibrator and the PCB, and in a top plan view of the vibratory alert device there is no overlap between the battery and the vibrator, no overlap between the battery and the PCB, and no overlap between the vibrator and the PCB.

2. The vibratory alert device of claim 1 wherein the plane also extends through the antenna and is parallel with an exterior surface of a housing of the vibratory alert device.

3. The vibratory alert device of claim 1 wherein the battery is a non-rechargeable coin-shaped battery that is user replaceable by opening the battery compartment, and wherein the battery has a positive electrode surface on one side of the battery and a negative electrode surface on an opposite side of the battery and the plane is parallel to both of the electrode surfaces.

4. The vibratory alert device of claim 3, wherein the housing has a substantially oval shape.

5. The vibratory alert device of claim 3 wherein the battery compartment includes a gasket that couples to each removable door.

6. The vibratory alert device of claim 5 wherein each removable door includes a bayonet mount that is configured to fittingly mate with a corresponding bayonet mount on the housing as part of the modular battery door system and wherein each removable door includes as the attachment mechanism a different one of (a) a clip; (b) an eyelet; (c) a Velcro surface; (d) a magnet or ferrous disk; (e) an alligator clip; (f) a finger ring; or (g) a flat door with a coin slot.

7. The vibratory alert device of claim 6 wherein the antenna is disposed on the PCB or on a separate substrate.

8. A vibratory alert device comprising:
    a vibrator;
    a battery;
    a printed circuit board coupled to the battery and to the vibrator;
    an antenna coupled to the printed circuit board, wherein the printed circuit board includes a transceiver;
    a modular battery door system configured to receive a set of doors each having a first mounting surface protruding from the door;
    a housing having a compartment enclosing the vibrator and the printed circuit board and a separate battery compartment having a second mounting surface within the battery compartment as part of the modular battery door system, the first mounting surface and the second mounting surface forming a bayonet or screw mount for coupling each door to the housing, wherein each door is removable from the housing to allow a user to replace a battery contained within the battery compartment, and wherein the battery, the vibrator, and the printed circuit board have a non-stacking arrangement, and in a top plan view of the vibratory alert device there is no overlap between the battery and the vibrator, no overlap between the battery and the printed circuit board, and no overlap between the vibrator and the printed circuit board; and
    an attachment mechanism coupled to each door, the attachment mechanism configured to attach the vibratory alert device to a user or the user's clothing and the attachment mechanism being one of (1) a clip; (2) an eyelet; (3) a ring; (4) a magnet or ferrous disk; (5) a Velcro surface; (6) an alligator clip; (7) a finger ring; or (8) a flat door with a coin slot, wherein the set of doors are interchangeable and the attachment mechanism for each door is different.

9. A vibratory alert device comprising:
    a vibrator;
    an antenna;
    a battery compartment;
    a printed circuit board (PCB) which includes a wireless transceiver, wherein the battery compartment, the vibrator, and the PCB have a non-stacking arrangement such that a plane extending through the battery compartment also extends through the vibrator and the PCB, and in a top plan view of the vibratory alert device there is no overlap between the battery and the vibrator, no overlap between the battery and the PCB, and no overlap between the vibrator and the PCB;

a modular battery door system configured to receive a set of doors including a first door and a second door, the first door having a first attachment device and the second door having a second attachment device that is different than the first attachment device, wherein the first door and the second door each have a first mounting surface protruding from the door, and the first door and the second door are interchangeable and are selected for use based on a desired attachment device; and a housing having a second mounting surface within the battery compartment as part of the modular battery door system, the first mounting surface and the second mounting surface forming a bayonet or screw mount for coupling either of the first door or the second door to the housing, wherein the first door or the second door, when coupled to the housing, are removable from the housing to allow a user to replace a battery contained within the battery compartment.

10. The vibratory alert device of claim 9 wherein the housing is elongated and has a substantially uniform width that substantially corresponds to a width of the battery compartment and the non-stacking arrangement of the battery compartment, the vibrator, and the PCB are aligned along a length of the housing.

11. The vibratory alert device as in claim 9 wherein the first door and the second door are elongated and have a width that substantially corresponds to a width of the housing.

12. The vibratory alert device as in claim 9 wherein the first mounting surface protruding from each of the first door and the second door are shaped to encompass a coin-shaped battery.

13. The vibratory alert device of claim 12 wherein the housing is elongated and has a substantially uniform width that substantially corresponds to a width of the battery compartment and the non-stacking arrangement of the battery compartment, the vibrator, and the PCB are aligned along a length of the housing.

14. The vibratory alert device as in claim 12 wherein the first door and the second door are elongated and have a width that substantially corresponds to a width of the housing.

15. The vibratory alert device as in claim 8 wherein the transceiver includes a wireless personal area network (PAN) transceiver.

16. The vibratory alert device of claim 8 wherein the housing is elongated and has a substantially uniform width that substantially corresponds to a width of the battery compartment and the non-stacking arrangement of the battery, the vibrator, and the printed circuit board are aligned along a length of the housing.

17. The vibratory alert device as in claim 16 wherein each door is elongated and has a width that substantially corresponds to the width of the housing, and wherein the first mounting surface is shaped to encompass a coin-shaped battery.

18. The vibratory alert device as in claim 8 wherein the compartment enclosing the vibrator and the printed circuit board is a sealed compartment and the separate battery compartment is sealed only when the door is coupled to the housing.

19. The vibratory alert device of claim 6 wherein a width of the housing substantially corresponds to a diameter of the battery compartment and the non-stacking arrangement of the battery, the vibrator, and the PCB are aligned along a length of the housing.

20. The vibratory alert device of claim 19 wherein the vibrator and the PCB are enclosed within a sealed portion of the housing and the battery is sealed within the housing only when the removable door is coupled to the housing, and wherein each removable door has a width that substantially corresponds to the diameter of the battery compartment.

* * * * *